United States Patent
Dempoh

(10) Patent No.: US 11,208,724 B2
(45) Date of Patent: Dec. 28, 2021

(54) FILM FORMING APPARATUS

(71) Applicant: TOKYO ELECTRON LIMITED, Tokyo (JP)

(72) Inventor: Kazuki Dempoh, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 301 days.

(21) Appl. No.: 15/973,331

(22) Filed: May 7, 2018

(65) Prior Publication Data
US 2018/0327904 A1  Nov. 15, 2018

(30) Foreign Application Priority Data

May 9, 2017  (JP) .............................. JP2017-092820

(51) Int. Cl.
*C23C 16/40* (2006.01)
*C23C 16/455* (2006.01)
*C23C 16/509* (2006.01)
*C23C 16/505* (2006.01)

(52) U.S. Cl.
CPC .. *C23C 16/45591* (2013.01); *C23C 16/45504* (2013.01); *C23C 16/505* (2013.01); *C23C 16/5096* (2013.01)

(58) Field of Classification Search
CPC ............ C23C 16/45591; C23C 16/505; C23C 16/45504; C23C 16/5096
USPC ............ 118/715; 156/345.1, 345.43, 345.44, 156/345.45, 345.46, 345.47
See application file for complete search history.

(56) References Cited

U.S. PATENT DOCUMENTS

| | | | | | |
|---|---|---|---|---|---|
| 4,976,996 | A | * | 12/1990 | Monkowski | .......... C23C 16/455 118/719 |
| 6,331,212 | B1 | * | 12/2001 | Mezey, Sr. | ........ H01L 21/67109 118/724 |
| 2008/0092812 | A1 | * | 4/2008 | McDiarmid | ...... H01L 21/67017 118/695 |

FOREIGN PATENT DOCUMENTS

| | | | | |
|---|---|---|---|---|
| JP | H09-223685 | A | | 8/1997 |
| JP | 2004-091848 | | | 3/2004 |
| JP | 2006-216597 | A | * | 8/2006 ............ H01L 21/31 |
| JP | 3880096 | B2 | | 2/2007 |
| JP | 3953984 | B2 | | 8/2007 |
| JP | 5262338 | B2 | | 8/2013 |
| JP | 2014-60309 | A | | 4/2014 |

* cited by examiner

*Primary Examiner* — Rudy Zervigon
(74) *Attorney, Agent, or Firm* — Fenwick & West LLP

(57) ABSTRACT

A film forming apparatus includes a mounting table on which a substrate is mounted; a ceiling plate facing the mounting table, the ceiling plate defining a processing space between the ceiling plate and mounting table; and a gas supply mechanism configured to supply a source gas to the processing space horizontally with respect to the substrate. A facing surface of the ceiling plate or a facing surface of the mounting table is inclined such that a gap between the facing surfaces of the mounting table and the ceiling plate becomes wider at a downstream side than at an upstream side in a flow direction of the source gas.

13 Claims, 16 Drawing Sheets

… (1)

FILM FORMING APPARATUS

CROSS-REFERENCE TO RELATED APPLICATIONS

This application claims priority to Japanese Patent Application No. 2017-092820 filed on May 9, 2017, the entire contents of which are incorporated herein by reference.

FIELD OF THE INVENTION

The present disclosure relates to a film forming apparatus.

BACKGROUND OF THE INVENTION

Conventionally, there is known a side flow type film forming apparatus for forming a predetermined film on a surface of a substrate by introducing a source gas horizontally with respect to the substrate to form a flow of the source gas in parallel with the surface of the substrate (see, e.g., Japanese Patent Application Publication No. 2004-91848).

However, in the side flow type film forming apparatus, a pressure difference occurs between an upstream side and a downstream side in the flow direction of the source gas, and this may lead to non-uniformity of a gas density between the upstream side and the downstream side. When the gas density becomes non-uniform, distribution of characteristics (e.g., a film thickness, a film quality or the like) of a film formed on the surface of the substrate becomes non-uniform and, thus, satisfactory in-plane uniformity is not obtained.

SUMMARY OF THE INVENTION

In view of the above, the present disclosure provides a film forming apparatus capable of improving in-plane uniformity of a film.

In accordance with an aspect, there is provided a film forming apparatus including: a mounting table on which a substrate is mounted; a ceiling plate facing the mounting table, the ceiling plate defining a processing space between the ceiling plate and the mounting table; and a gas supply mechanism configured to supply a source gas to the processing space horizontally with respect to the substrate, wherein a facing surface of the ceiling plate or a facing surface of the mounting table is inclined such that a gap between the facing surfaces of the mounting table and the ceiling plate becomes wider at a downstream side than at an upstream side in a flow direction of the source gas.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
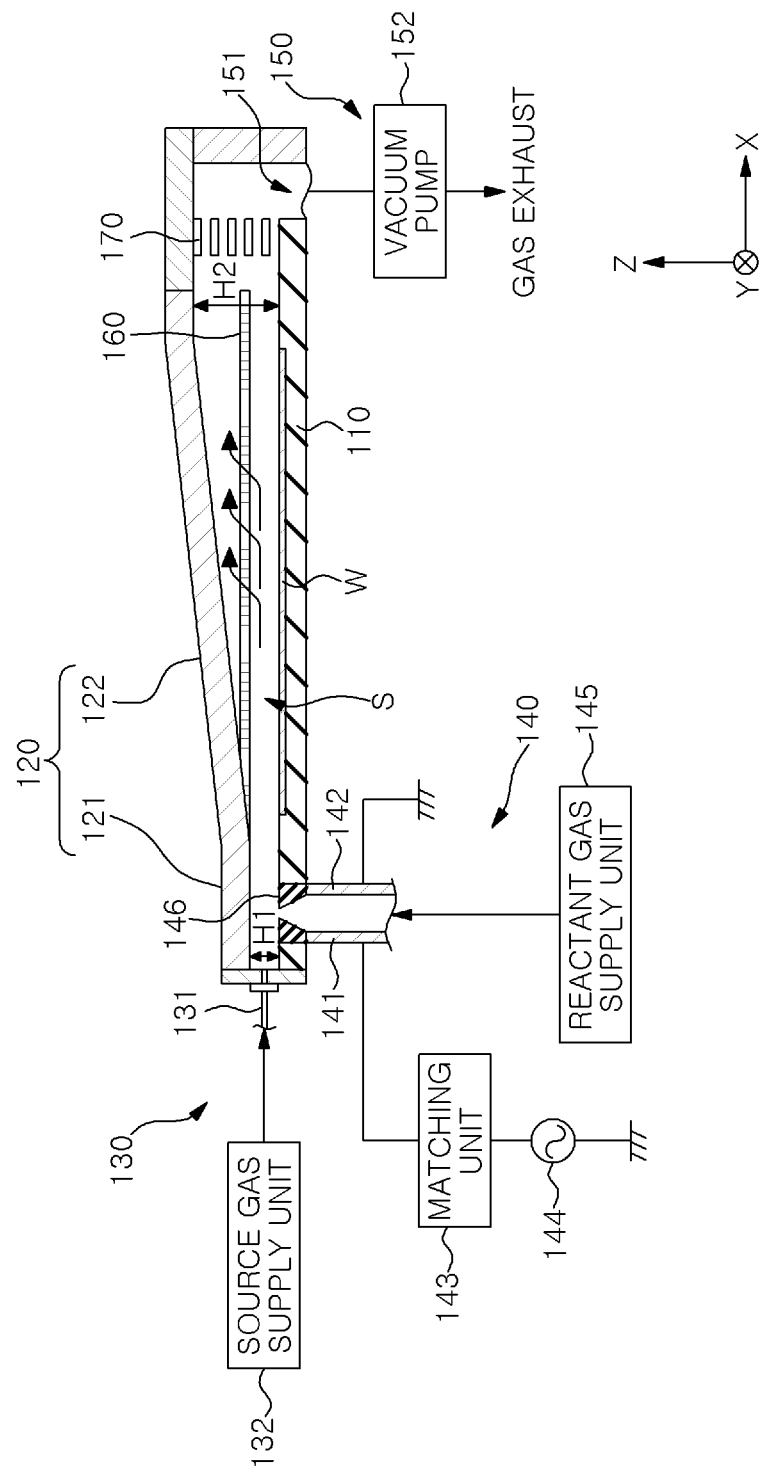
FIG. 1 schematically shows a first configuration example of a film forming apparatus according to a first embodiment.

Hereinafter, embodiments will be described with reference to the accompanying drawings. Like reference numerals will be used for substantially like parts throughout the specification and the drawings, and redundant description thereof will be omitted.

The film forming apparatus according to the embodiment is a side flow type film forming apparatus for forming a predetermined film on a surface of a substrate by introducing a source gas horizontally with respect to the substrate to form a flow of the source gas in parallel with the surface of the substrate. In the film forming apparatus, a film can be formed by an ALD (Atomic Layer Deposition) method or a CVD (Chemical Vapor Deposition) method.

The film forming apparatus includes: mounting table for mounting thereon a substrate; a ceiling plate facing the mounting table, the ceiling plate defining a processing space between the ceiling plate and mounting table; and a gas supply mechanism for supplying a source gas to the processing space horizontally with respect to the substrate. Further, the film forming apparatus is characterized in that a facing surface of the ceiling plate or the mounting table is inclined such that a gap between the facing surfaces of the mounting table and the ceiling plate becomes wider at a downstream side than at an upstream side in a flow direction of the source gas.

In accordance with the film forming apparatus configured as described above, it is possible to improve uniformity of a gas density between the upstream side and the downstream side by decreasing a pressure difference between the upstream side and the downstream side in the flow direction of the source gas. As a result, in-plane uniformity of characteristics (e.g., a film thickness, a film quality or the like) of a film formed on a surface of the substrate can be improved.

Hereinafter, a specific configuration example of a film forming apparatus capable of improving the in-plane uniformity of the film will be described.

First Embodiment (Film Forming Apparatus)

Figure 2:
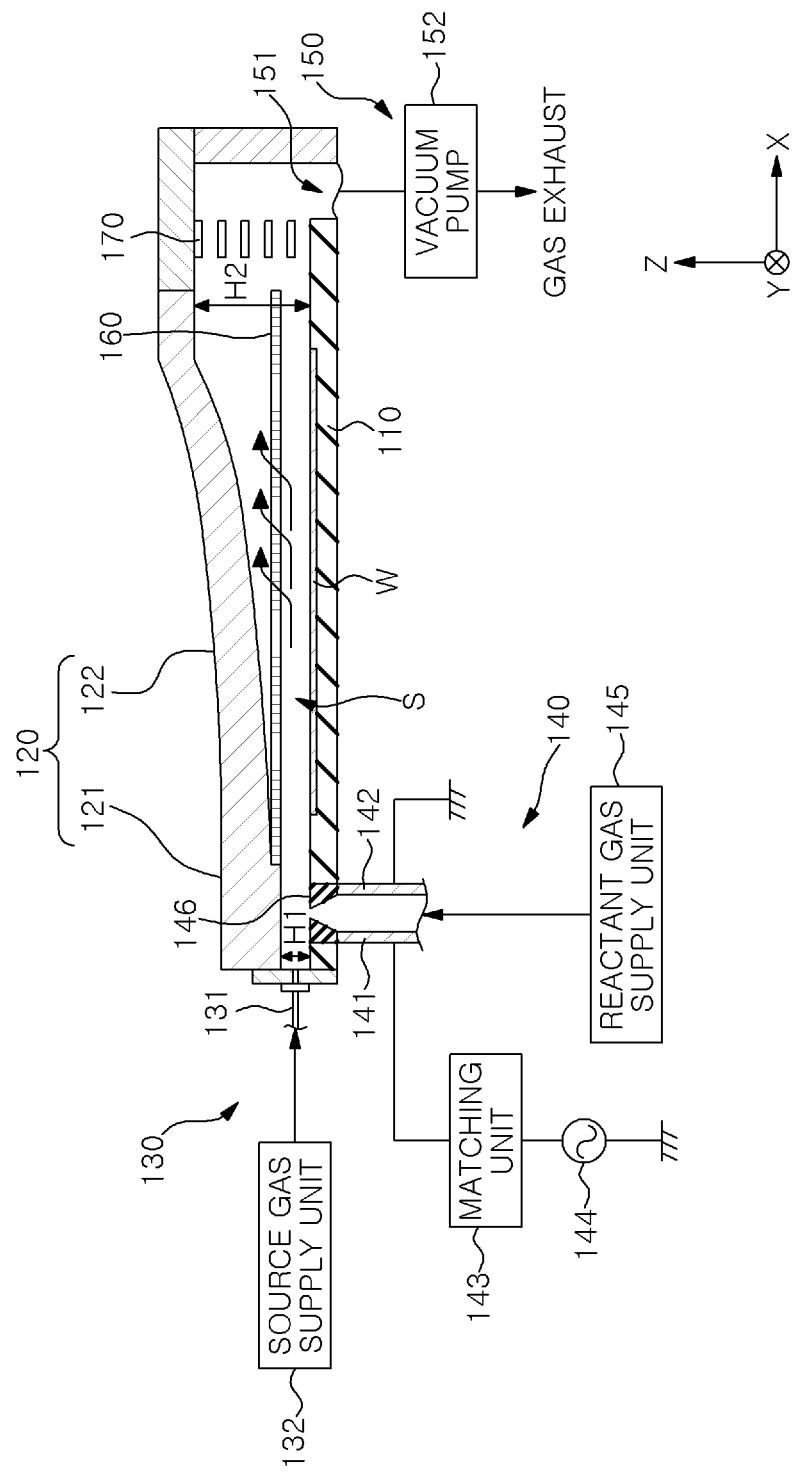
FIG. 2 schematically shows a second configuration example of the film forming apparatus according to the first embodiment.
Figure 3:
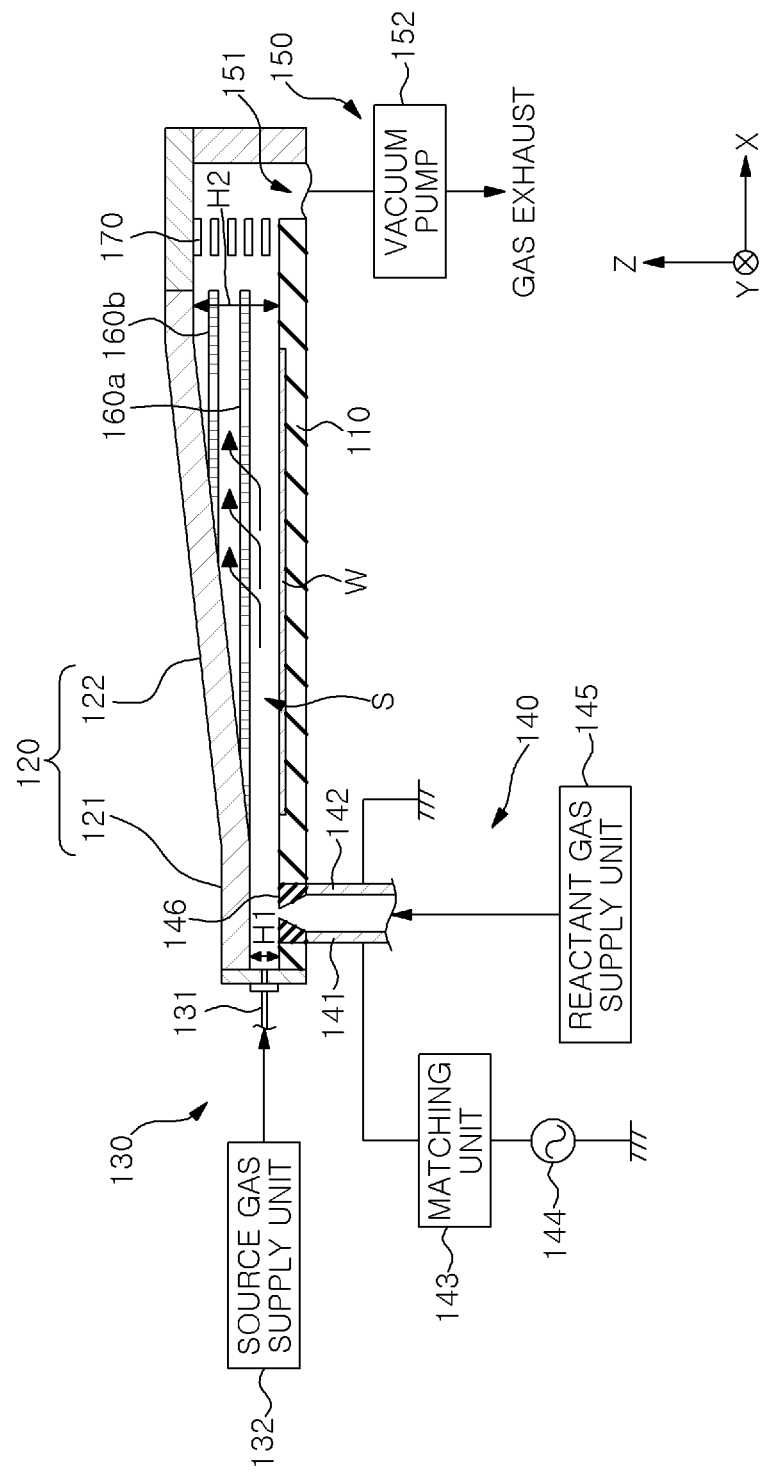
FIG. 3 schematically shows a third configuration example of the film forming apparatus according to the first embodiment.
Figure 4:
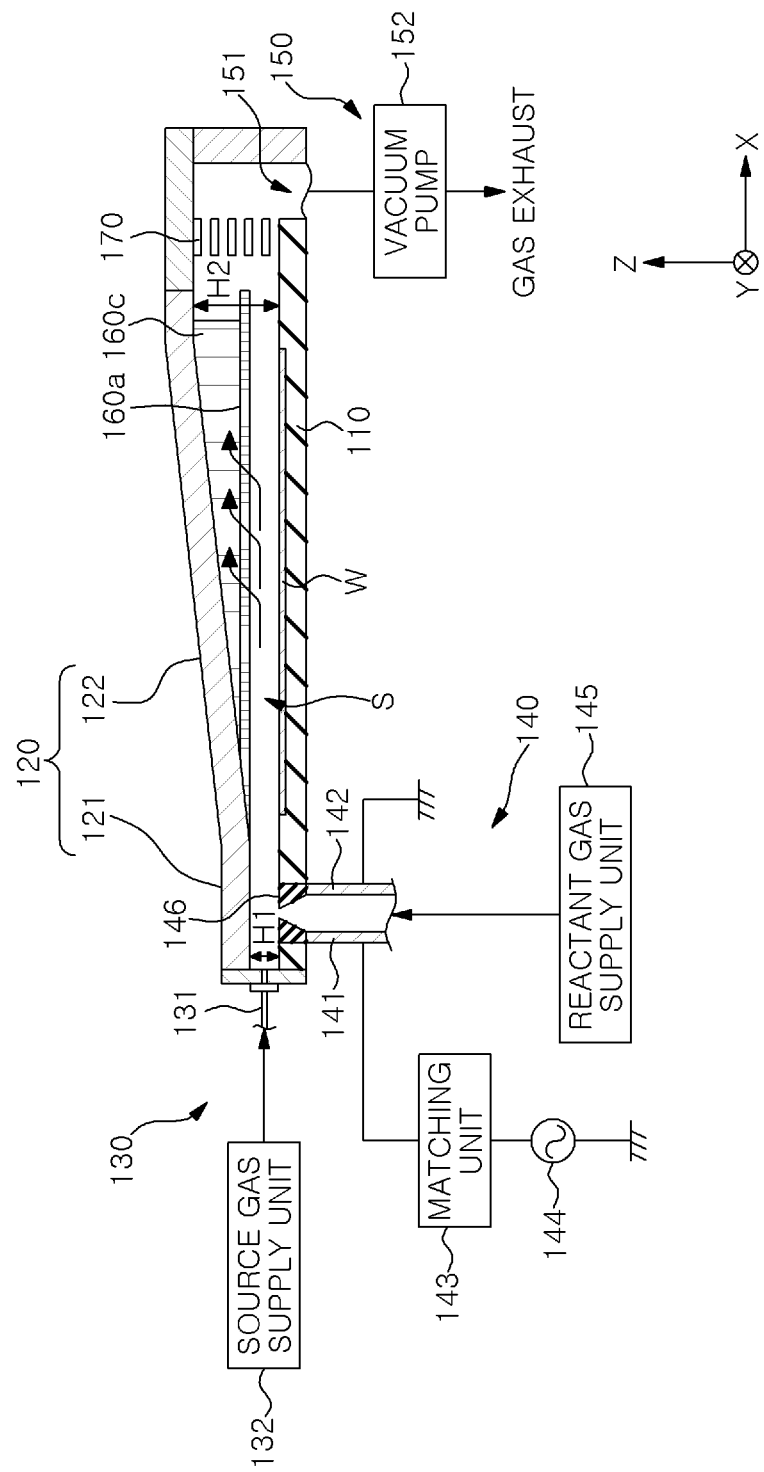
FIG. 4 schematically shows a fourth configuration example of the film forming apparatus according to the first embodiment.

The film forming apparatus according to the first embodiment will be described. FIG. 1 schematically shows a first configuration example of a film forming apparatus according to the first embodiment. FIG. 2 schematically shows a second configuration example of the film forming apparatus according to the first embodiment. FIG. 3 schematically shows a third configuration example of the film forming apparatus according to the first embodiment. FIG. 4 schematically shows a fourth configuration example of the film forming apparatus according to the first embodiment.

As shown in FIG. 1, the film forming apparatus includes a mounting table 110, a ceiling plate 120, a first gas supply mechanism 130, a second gas supply mechanism 140, a gas exhaust unit 150, a baffle plate 160, and a rectifying blade 170. The mounting table 110 and the ceiling plate 120 constitute a processing chamber defining a processing space S for performing a film forming process on a substrate W such as a semiconductor wafer or the like. A bottom plate (not shown) and the ceiling plate 120 may constitute the processing chamber, and the mounting table 110 may be provided in the processing chamber.

The mounting table 110 is configured to mount the substrate W on an upper surface thereof. The mounting table 110 is made of, e.g., a ceramic material such as aluminum nitride (AlN) or the like.

The ceiling plate 120 is provided above the mounting table 110 to face the mounting table 110 and defines the processing space S between itself and the mounting table 110. The ceiling plate 120 is made of, e.g., a metal material. The ceiling plate 120 has a horizontal portion 121 and an inclined portion 122. The horizontal portion 121 is closer to the first gas supply mechanism 130 and formed in parallel with the upper surface of the mounting table 110. The inclined portion 122 is closer to the gas exhaust unit 150 compared to the horizontal portion 121 and has a flat surface whose height with respect to the upper surface of the mounting table 110 is gradually increased from the first gas supply mechanism 130 side toward the gas exhaust unit 150 side. Accordingly, a height H2 of the ceiling plate 120 near the gas exhaust unit 150 is higher than a height H1 of the ceiling plate 120 near the first gas supply mechanism 130. In other words, a gap between the facing surfaces of the mounting table 110 and the ceiling plate 120 is wider at a downstream side than at an upstream side in a flow direction of a source gas (+X direction in the drawing). The height of the ceiling plate 120 with respect to the mounting table 110 in a direction (Y direction in the drawing) perpendicular to the flow direction of the source gas may be constant or may be changed. The ceiling plate 120 may be movable in a vertical direction. For example, the gap between the facing surfaces of the mounting table 110 and the ceiling plate 120 is increased by moving the ceiling plate 120 away from the mounting table 110, which makes loading/unloading of the substrate to/from the upper surface of the mounting table 110 easier. As shown in FIG. 2, the inclined portion 122 may be formed to have a curved surface whose height with respect to the upper surface of the mounting table 110 becomes higher from the first gas supply mechanism 130 side toward the gas exhaust unit 150 side. The ceiling plate 120 may not have the horizontal portion 121 as long as it has the inclined portion 122.

The first gas supply mechanism 130 supplies a source gas to the processing space S horizontally with respect to the substrate W. The first gas supply mechanism 130 includes a line 131 connected to a side surface of the processing chamber and source gas supply unit 132 connected to one end of the line 131 which is opposite to the other end connected to the processing chamber. Accordingly, the source gas is supplied from the source gas supply unit 132 to the processing space S. The type of the source gas is not particularly limited, but it may be a silicon-containing gas such as $Si_2Cl_6$, HCDS (hexachlorodisilane), TDMAS (trimethylaminosilane), BDEAS (bisdiethylaminosilane) or the like. Further, the source gas may be a metal-containing gas such as $TiCl_4$ or the like. The first gas supply mechanism 130 may be configured to supply a carrier gas such as Ar, $N_2$, or the like, together with the source gas.

The second gas supply mechanism 140 supplies a plasma of a reactant gas to the processing space S from the bottom of the mounting table 110. The second gas supply mechanism 140 includes first electrode and a second electrode 142 provided in parallel with each other. The first electrode 141 is electrically connected to a high frequency power supply 144 via a matching unit 143. The second electrode 142 grounded. In addition, a reactant gas supply unit 145 for supplying a reactant gas to a space between the first electrode 141 and the second electrode 142 is provided. Accordingly, the reactant gas supplied from the reactant gas supply unit 145 is converted into plasma in the space between the first electrode 141 and the second electrode 142 and then supplied to the processing space S. The type of the reactant gas is not particularly limited, but it may be, e.g., oxidizing gas such as oxygen ($O_2$) ozone ($O_3$) or the like, a nitriding gas such as ammonia ($NH_3$) or the like, or reducing gas such as hydrogen ($H_2$) or the like. A throttle portion 146 made of a dielectric material is formed at portions of the first electrode 141 and the second electrode 142 which face the processing space S.

The gas exhaust unit 150 exhausts a gas in the processing space S. The gas exhaust unit 150 has a gas exhaust port 151 formed at a lower portion of a side surface opposite to the side surface to which the first gas supply mechanism 130 is connected, among side surfaces of the processing chamber. A vacuum pump 152, a valve (not shown) and the like are connected to the gas exhaust port 151 so that the processing space S can be evacuated to vacuum.

The baffle plate 160 adjusts the flow of the source gas. The baffle plate 160 is attached to a lower surface of the ceiling plate 120 to be parallel with the upper surface of the mounting table 110. In the illustrated example, the baffle plate 160 extends from the boundary portion between the horizontal portion 121 and the inclined portion 122 on the lower surface of the ceiling plate 120 toward the gas exhaust unit 150. The baffle plate 160 may be a perforated plate or a mesh plate. Further, the baffle plate 160 may be made of a metal material or a dielectric material. By providing the baffle plate 160, the plane uniformity of the temperature of the substrate W can be improved.

A plurality of baffle plates 160 may be provided. For example, the baffle plate 160 may have a configuration in which a plurality of (e.g., two) baffle plates 160a and 160b in parallel with each other are attached to the lower surface of the ceiling plate 120, as shown in FIG. 3. In such a configuration, both of the baffle plates 160a and 160b may be porous plates or mesh plates. Further, one of the baffle plates 160a and 160b may be a perforated plate and the other one may be a mesh plate.

For example, there may be employed a configuration in which a baffle plate 160a provided in parallel with the upper surface of the mounting table 110 and a baffle plate 160c provided in a direction perpendicular to the baffle plate 160a are attached to the lower surface of the ceiling plate 120, as shown in FIG. 4. In such a configuration, both of the baffle plates 160*a* and 160*c* may be perforated plates or mesh plates. Further, one of the baffle plates 160*a* and 160*b* may be a perforated plate and the other one may be a mesh plate. The baffle plate 160*c* may be inclined at a predetermined angle with respect to the baffle plate 160*a*.

Figure 5A:
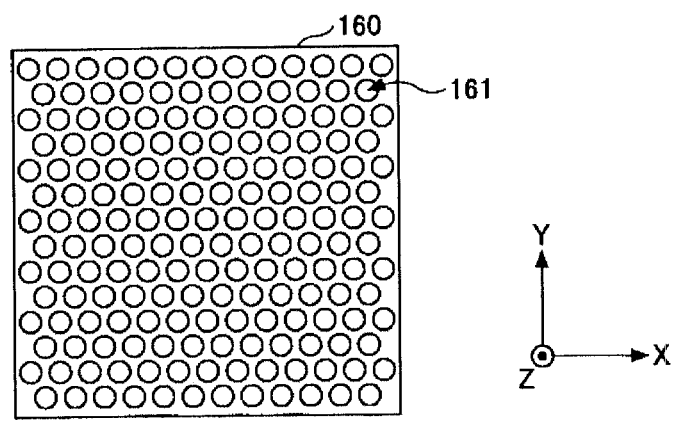
FIGS. 5A to 5C explain shapes of baffle plates.
Figure 5B:
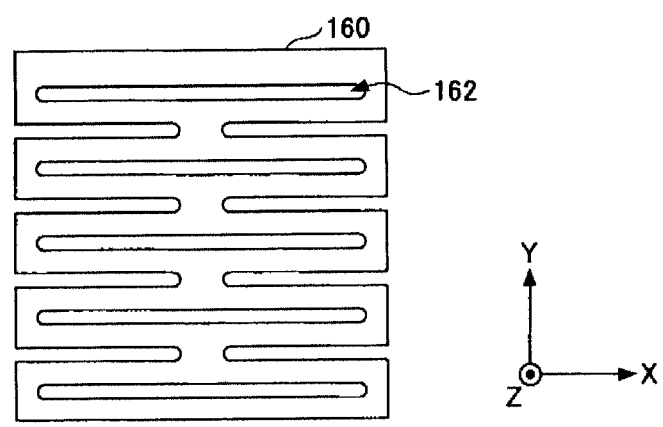
Figure 5C:
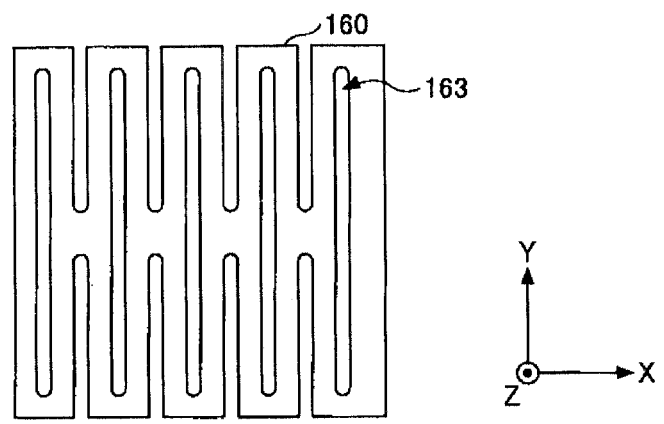

FIGS. 5A to 5C explain shapes of the baffle plate 160 seen from the top. The baffle plate 160 may be a perforated plate having a plurality of through-holes 161, as shown in FIG. 5A. Further, the baffle plate 160 may be a perforated plate having slits 162 whose longitudinal direction is parallel with the flow direction of the source gas (+X direction in the drawing), as shown in FIG. 5B. Further, the baffle plate 160 may be a perforated plate having slits 163 whose longitudinal direction is perpendicular to the flow direction of the source gas, as shown in. FIG. 5C.

Figure 6A:
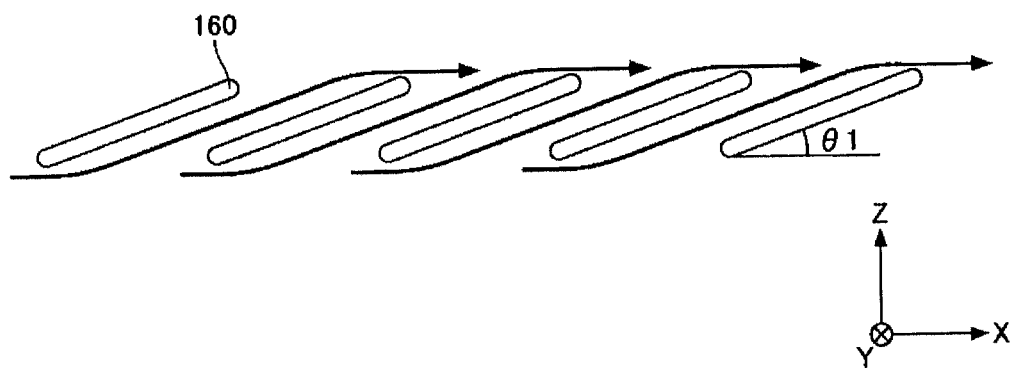
FIGS. 6A and 6B are cross sectional views for explaining shapes of a baffle plate.
Figure 6B:
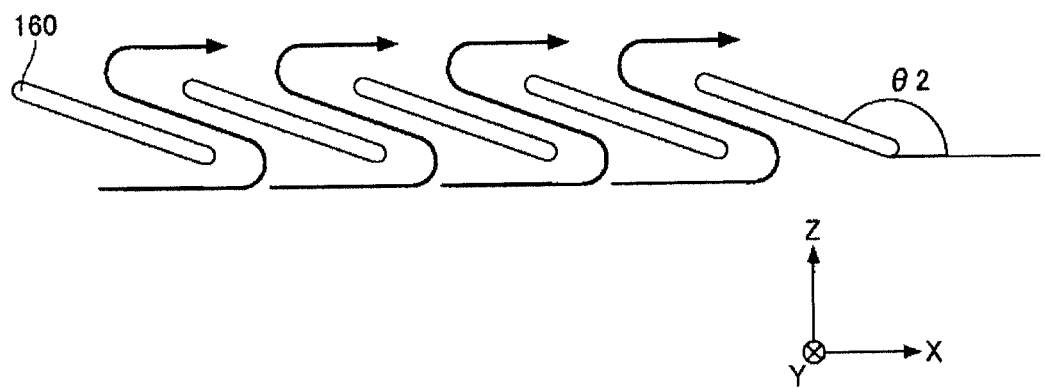

FIGS. 6A and 6B are cross sectional views of the baffle plate 160 which explain shapes of the baffle plate 160. In FIGS. 6A and 6B, cross sections of the baffle plate 160 having a plurality of airfoil slits are illustrated. As shown in FIG. 6A, the airfoil slits may be arranged in parallel with each other at a predetermined angle θ1 (θ1 being an acute angle) with respect to the flow direction of the source gas (+X direction in the drawing). Further, as shown in FIG. 6B, the airfoil slits may be arranged in parallel with each other at a predetermined angle θ2 (θ2 being an obtuse angle) with respect to the flow direction of the source gas. The predetermined angles θ1 and θ2 may vary. By varying the predetermined angles θ1 and θ2, it is possible to adjust the flow of the source gas depending on processing conditions.

Although it is not necessary to provide the baffle plate 160, it is preferable to provide the baffle plate 160 in order to improve the in-plane uniformity of the temperature of the substrate W.

The baffle plate 160 may be movable so that it can be retreated when loading and unloading the substrate W.

The rectifying blade 170 rectifies the source gas flowing from the processing space S toward the gas exhaust port 151.

The film forming apparatus may further include a heating unit (not shown) for heating the respective components such as the mounting table 110, the ceiling plate 120 and the like, and a temperature sensor (not shown) for detecting temperatures of the respective components such as the mounting table 110, the ceiling plate 120 and the like. In that case, the temperatures of the mounting table 110, the ceiling plate 120 and the like can be adjusted by controlling the heating unit based on a detection value of the temperature sensor.

(Theoretical Analysis)

In order to check the operation and the effect of the film forming apparatus according to the first embodiment, the relation between a position x (m) and a pressure p (Pa) in the flow direction of the source gas was calculated by theoretical analysis. The followings are conditions of the theoretical analysis.

<Conditions of Theoretical Analysis: First Embodiment>

Length of the mounting table 110 along the flow direction of the source gas: 500 mm Length of the mounting table 110 along a direction perpendicular to the flow direction of the source gas: 500 mm Gap H1 between the upper surface of the mounting table 110 and the lower surface of the horizontal portion 121: 5 mm Gap H2 between the upper surface of the mounting table 110 and the lower surface of the right end of the inclined portion 122: 50 mm Gas temperature: 100° C.

Flow rate of Ar gas supplied from the first gas supply mechanism 130: 2000 sccm Pressure at a connecting portion between the processing space S and the gas exhaust part 150: 133 Pa Baffle plate 160: not provided For comparison, the relation between the position x (m) and the pressure p (Pa) in the flow direction of the source gas, in the case of a film forming apparatus in which a distance between the upper surface of the mounting table 110 and the lower surface of the ceiling plate 120 is constant, was also calculated by theoretical analysis. The followings are conditions of the theoretical analysis.

<Conditions of Theoretical Analysis: Comparative example>

Length of the mounting table 110 along the flow direction of the source gas: 500 mm Length of the mounting table 110 along a direction perpendicular to the flow direction of the source gas: 500 mm Gap between the upper surface of the mounting table 110 and the lower surface of the horizontal portion 121: 5 mm (constant)

Gas temperature: 100° C.

Flow rate of Ar gas supplied from the first gas supply mechanism 130: 2000 sccm Pressure at a connecting portion between the processing space S and the gas exhaust part 150: 133 Pa Baffle plate 160: not provided The following equation (1) is derived from an equation of a conductance of a parallel flat plate of gas in a viscous flow region and represents a pressure drop −dp between minute distances dx at a position x.

$$-pdp = \frac{12\mu GRT}{W} \frac{dx}{h^3} \qquad \text{Eq. (1)}$$

P: pressure
μ: viscosity coefficient
G: mass flow rate
T: gas temperature
W: length of mounting table in a direction perpendicular to the flow direction of the source gas
h: gap between the upper surface of the mounting table and the lower surface of the ceiling plate
R: gas constant per unit mass
value calculated by R=k/$m_g$ (k: Boltzmann constant, $m_g$: mass of one molecule)

Figure 7:
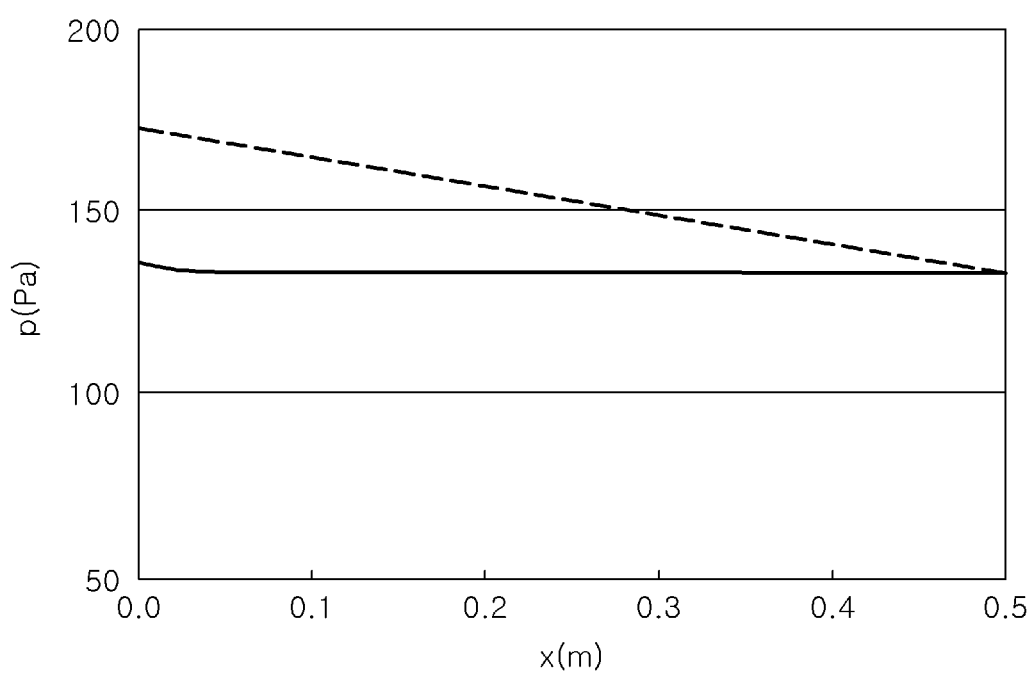
FIG. 7 shows a relation between a position and a pressure in a gas flow direction calculated by theoretical analysis.

FIG. 7 shows the relation between the position in the flow direction of the source gas and the pressure which is calculated by the theoretical analysis using Eq. (1). In FIG. 7, the horizontal axis represents the distance x (m) from a connecting position of the processing chamber with the first gas supply mechanism 130, and the vertical axis represents the pressure p (Pa). In FIG. 7, a solid line indicates a result obtained in the film forming apparatus according to the first embodiment, and a dashed line indicates a result obtained in the film forming apparatus of the comparative example in which the distance between the upper surface of the mounting table 110 and the lower surface of the ceiling plate 120 is constant. In FIG. 7, a mounting position x of a substrate of φ300 mm is 0.1 m to 0.4 m.

As shown in FIG. 7, in the film forming apparatus according to the first embodiment, the pressure is substantially uniform regardless of the position in the flow direction of the source gas. On the other hand, in the film forming apparatus of the comparative example, a pressure difference in which the pressure is higher at the upstream side and lower at the downstream side occurs between the upstream side and the downstream side in the flow direction of the source gas. Due to the pressure difference, it is difficult to accurately control a pressure on the substrate by using a pressure gauge that is provided at the upstream side or the downstream side of the substrate to set a pressure in the processing space S.

Meanwhile, an ideal gas state equation shown in the following equation (2) is established between a pressure and a gas density.

$$p = nkT \qquad \text{Eq. (2)}$$

P: pressure
n: gas density
k: Boltzmann constant
T: gas temperature

The relation between a gas density and adsorption of the source gas on the surface of the substrate satisfies the following equation (3).

$$\Gamma = \frac{1}{4} n \bar{v} \qquad \text{Eq. (3)}$$

$\Gamma$: flux of the source gas on the surface of the substrate
n: gas density
$\bar{v}$: average thermal velocity of source gas molecules Therefore, when the pressure difference occurs between the upstream side and the downstream side in the flow direction of the source gas, the gas density becomes non-uniform between the upstream side and the downstream side in the flow direction of the source gas. This is because the gas density n is proportional to the pressure p as can be seen from Eq. (2). If the gas density becomes non-uniform, the flux $\Gamma$ of the source gas to the surface of the substrate becomes non-uniform. This is because the flux $\Gamma$ of the source gas to the surface of the substrate is proportional to the gas density n, as can be seen from Eq. (3). As a result, distribution of characteristics (e.g., a film thickness, a film quality or the like) of a film formed on the surface of the substrate becomes non-uniform and, thus, satisfactory in-plane uniformity is not obtained.

On the other hand, in the film forming apparatus according to the first embodiment, the pressure difference between the upstream side and the downstream side in the flow direction of the source gas is small. Therefore, the non-uniformity of the gas density between the upstream side and the downstream side in the flow direction of the source gas hardly occurs from the relation shown in Eq. (2). Since the non-uniformity of the gas density hardly occurs, non-uniformity of the flux of the source gas to the surface of the substrate hardly occurs from the relation shown in Eq. (3). As a result, in-plane uniformity of the characteristics (e.g., a film thickness, a film quality or the like) of the film formed on the surface of the substrate can be improved.

From the above results of the theoretical analysis, it is preferable to incline the lower surface of the ceiling plate 120 such that the pressure becomes the same at the upstream side and the downstream side in the flow direction of the source gas based on the viscosity coefficient $\mu$ of the source gas, the gas temperature T, the mass flow rate G, and the pressure p.

As described above, in the film forming apparatus according to the first embodiment, the facing surface of the ceiling plate 120 is inclined such that the gap between the facing surfaces of the mounting table 110 and the ceiling Plate 120 becomes wider at the downstream side than at the upstream side in the flow direction of the source gas. Accordingly, the uniformity of the gas density between the upstream side and the downstream side can be improved by decreasing the pressure difference between the upstream side and the downstream side in the flow direction of the source gas. As a result, the in-plane uniformity of the film can be improved.

Particularly, according to Eq. (1), the variation of the pressure can be controlled by $h^3$ by changing the gap h between the upper surface of the mounting table 110 and the lower surface of the ceiling plate 120 rather than by changing the length W of the mounting table 110 along a direction perpendicular to the flow direction of the source gas. Therefore, in the present embodiment, the pressure difference between the upstream side and the downstream side is decreased by setting the gap h between the upper surface of the mounting table 110 and the lower surface of the ceiling plate 120 to be wider at the downstream side than at the upstream side.

Second Embodiment

Figure 8:
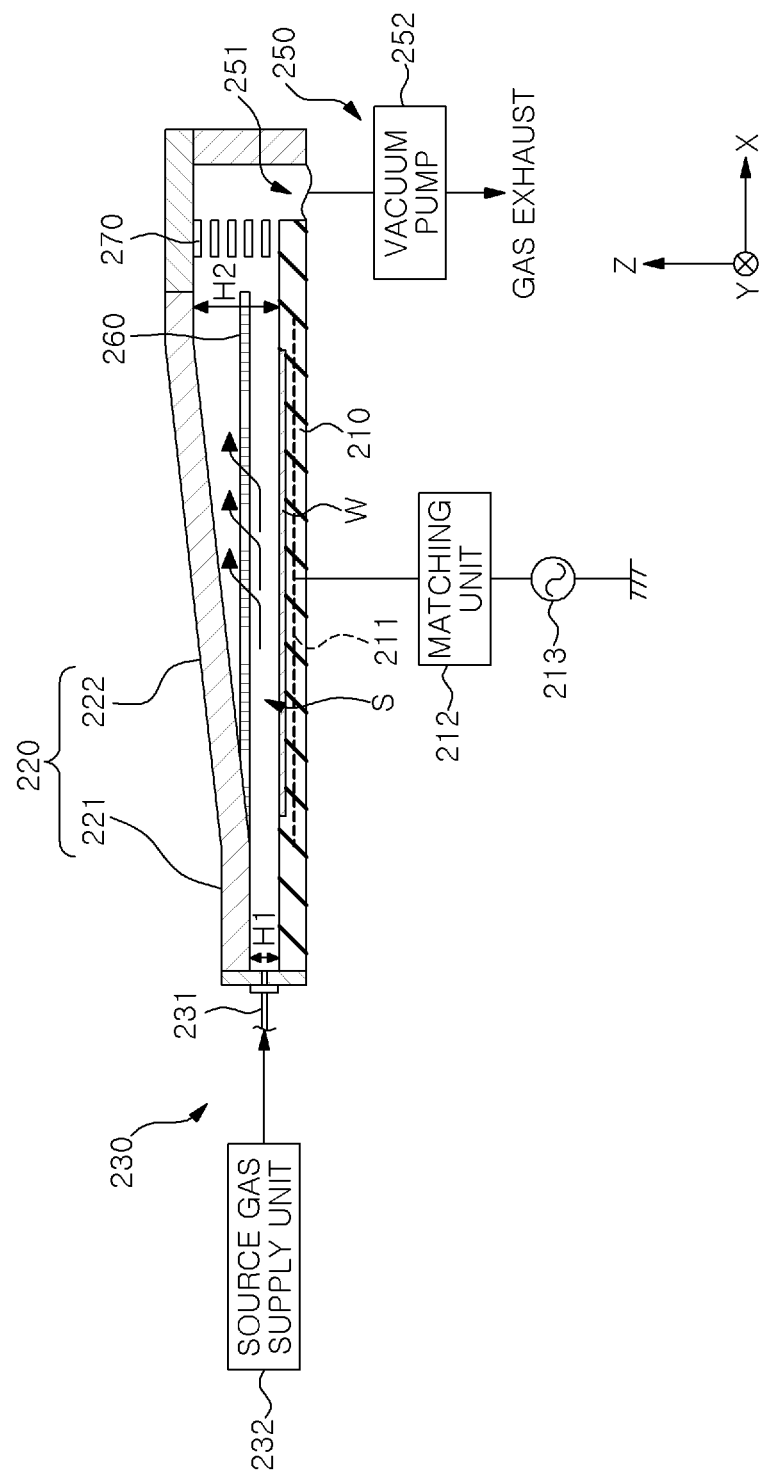
FIG. 8 schematically shows a first configuration example of a film forming apparatus according to a second embodiment.
Figure 9:
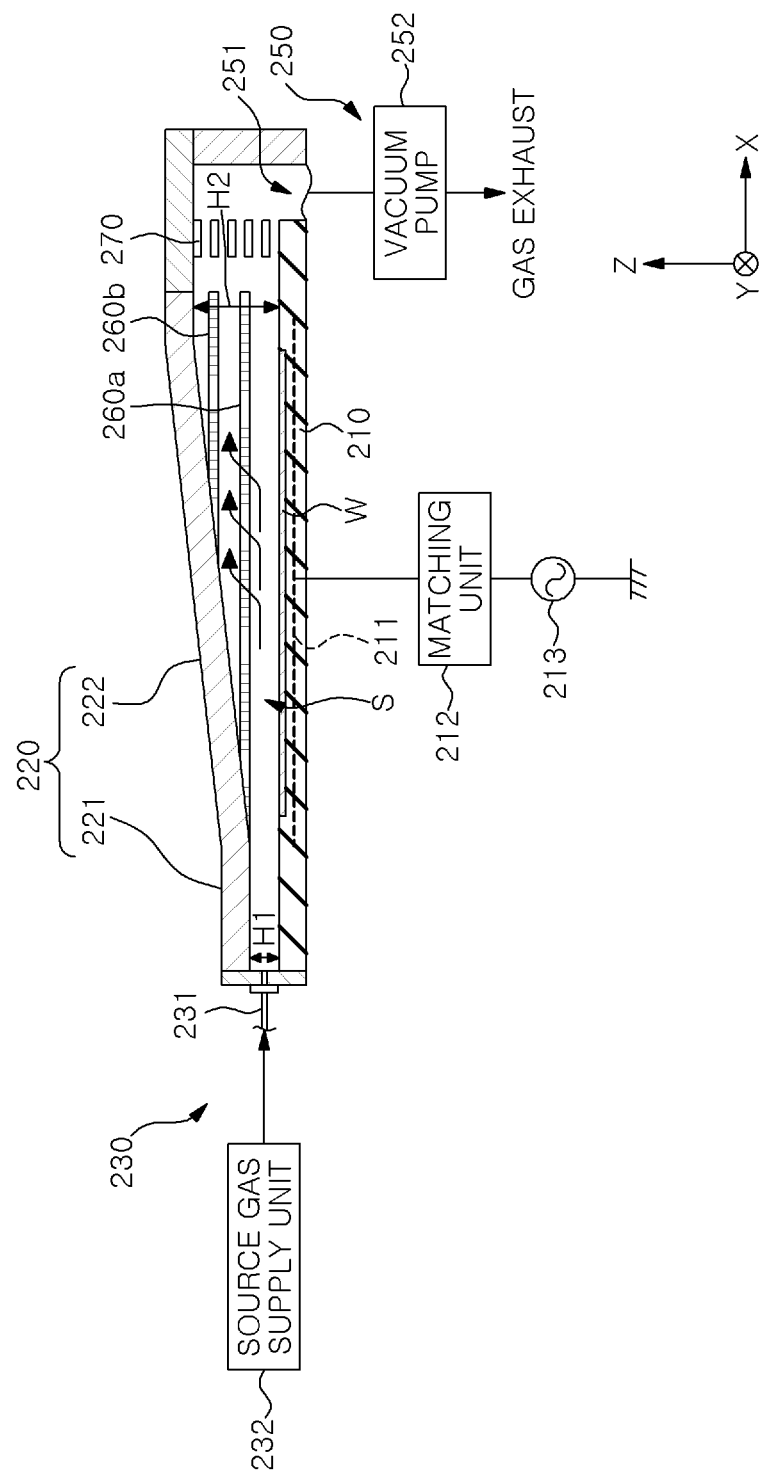
FIG. 9 schematically shows a second configuration example of the film forming apparatus according to the second embodiment.
Figure 10:
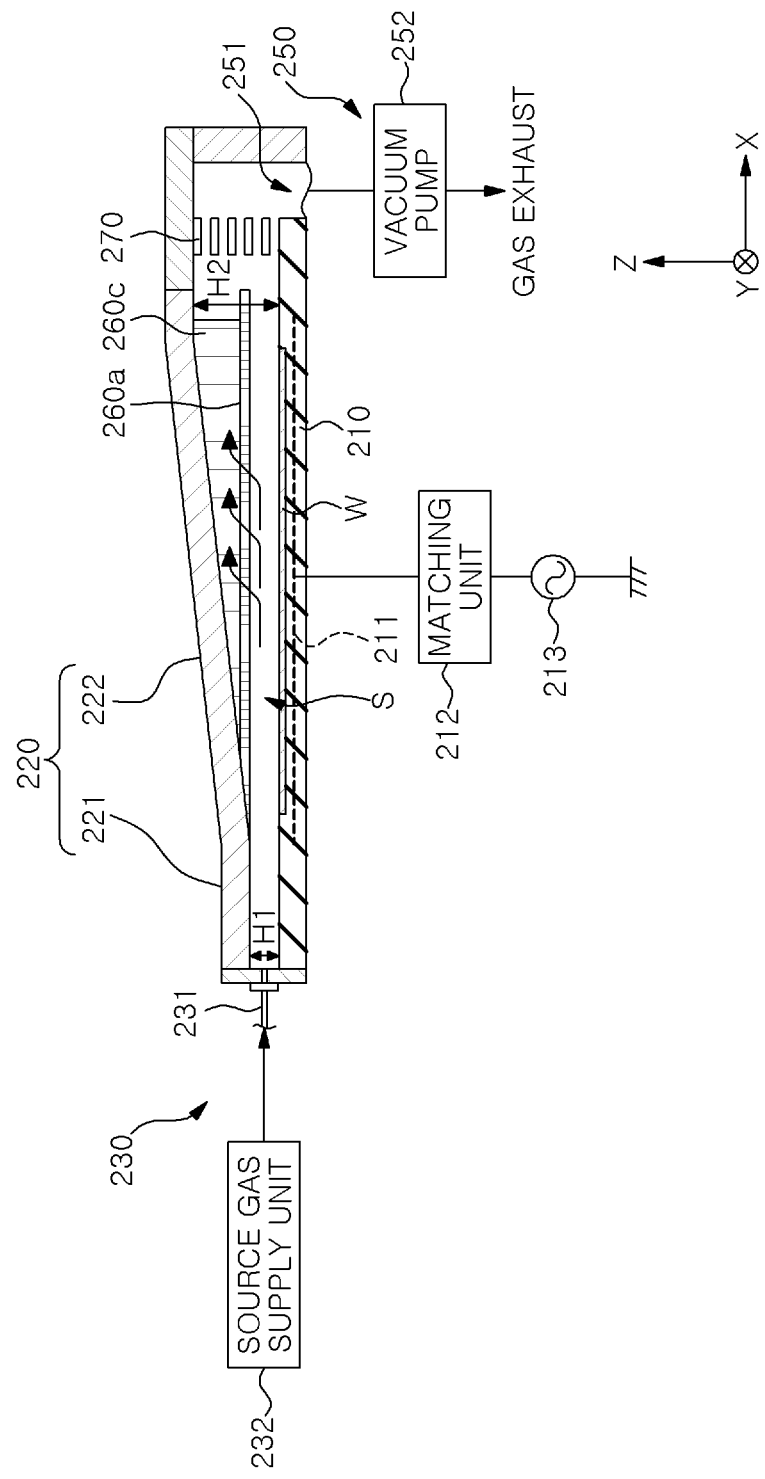
FIG. 10 schematically shows a third configuration example of the film forming apparatus according to the second embodiment.

A film forming apparatus according to a second embodiment will be described. FIG. 8 schematically shows a first configuration example of a film forming apparatus according to the second embodiment. FIG. 9 schematically shows a second configuration example of the film forming apparatus according to the second embodiment. FIG. 10 schematically shows a third configuration example of the film forming apparatus according to the second embodiment.

As shown in FIG. 8, the film forming apparatus according to the second embodiment is a capacitively coupled plasma processing apparatus capable of generating a plasma in a space between a mounting table 210 and a baffle plate 260. At this time, the mounting table 210 serves as a lower electrode and the baffle plate 260 serves as an upper electrode.

As shown in FIG. 8, the film forming apparatus includes a mounting table 210, a ceiling plate 220, a gas supply mechanism 230, a gas exhaust unit 250, a baffle plate 260, and a rectifying blade 270. The mounting table 210 and the ceiling plate 220 constitute a processing chamber defining a processing space S for performing a film forming process on the substrate W. A bottom plate (not shown) and the ceiling plate 220 may constitute the processing chamber, and the mounting table 210 may be provided in the processing chamber.

The mounting table 210 is configured to mount the substrate W on an upper surface thereof. The mounting table 210 is made of, e.g., a ceramic material such as aluminum nitride (AlN) or the like. A lower electrode 211 such as a mesh electrode or the like is provided in the mounting table 210. The lower electrode 211 is electrically connected to a high frequency power supply 213 via a matching unit 212. Accordingly, a high frequency power generated by the high frequency power supply 213 is supplied to the lower electrode 211 through the matching unit 212.

The ceiling plate 220 may have the same configuration as that of the ceiling plate 120 of the film forming apparatus according to the first embodiment. In other words, the ceiling plate 220 has a horizontal portion 221 and an inclined portion 222.

The gas supply mechanism 230 may have the same configuration as that of the first gas supply mechanism 130 of the film forming apparatus according to the first embodiment. In other words, the gas supply mechanism 230 includes a line 231 connected to a side surface of the processing chamber and a source gas supply unit 232 connected to one end of the line 231 which is opposite to the other end connected to the processing chamber. The gas supply mechanism 230 may be configured to supply a reactant gas in addition to the source gas and the carrier gas.

The gas exhaust unit 250 may have the same configuration as that of the gas exhaust unit 150 of the film forming apparatus according to the first embodiment. In other words, the gas exhaust unit 250 includes a gas exhaust port 251 and a vacuum pump 252.

The baffle plate 260 is attached to the lower surface of the ceiling plate 220 to be in parallel with the upper surface of the mounting table 210, and is made of a metal material. Therefore, the baffle plate 260 adjusts the flow of the source gas and serves as an electrode, i.e., an upper electrode, facing the lower electrode 211. The baffle plate 260 is grounded through the ceiling plate 220. The baffle plate 260 may be a perforated plate or a mesh plate. By providing the baffle plate 260, the plane uniformity of the temperature of the substrate W can be improved. Further, by providing the baffle plate 260, a plasma can be confined between the mounting table 210 and the baffle plate 260. Accordingly, the uniformity of the plasma can be improved.

A plurality of baffle plates 260 may be provided. Specifically, a plurality of (e.g., two) baffle plates 260a and 260b in parallel with each other with a predetermined gap therebetween may be attached to the lower surface of the ceiling plate 220, as shown in FIG. 9. In such a configuration, both of the baffle plates 260a and 260b may be perforated plates or mesh plates. Further, one of the baffle plates 260a and 260a may be a perforated plate and the other one may be a mesh plate.

For example, as shown in FIG. 10, a baffle plate 260a provided in parallel with the upper surface of the mounting table 210 and a baffle plate 160c provided in a direction perpendicular to the baffle plate 260a may be attached to the lower surface the ceiling plate 220. In such a configuration, both of the baffle plates 260a and 260c may be perforated plates or mesh plates. Further, one of the baffle plates 260a and 260b may be a perforated plate and the other one may be a mesh plate. The baffle pate 260c may be inclined at a predetermined angle with respect to the baffle plate 260a. By providing a plurality of baffle plates 260, the effect of confining the plasma in the processing space S can be enhanced.

Although is not necessary to provide the baffle plate 260, it is preferable to provide the baffle plate 260 in order to improve the in-plane uniformity of the temperature of the substrate W.

The baffle plate 260 may be movable so that it can be retreated when loading and unloading the substrate W.

The rectifying blade 270 rectifies the source gas flowing from the processing space S toward the gas exhaust port 251.

Similarly to the first embodiment, the film forming apparatus may further include a heating unit (not shown) for heating the respective components such as the mounting table 210, the ceiling plate 220 and the like, and a temperature sensor (not shown) for detecting temperatures of the respective components such as the mounting table 210, the ceiling plate 220 and the like. In that case, the temperatures of the mounting table 210, the ceiling plate 220 and the like can be adjusted by controlling the heating unit based on a detection value of the temperature sensor.

The electrodes, such as the lower electrode 211, the upper electrode and the like, of the film forming apparatus may have an impedance adjustment function (not shown).

As described above, in the film forming apparatus according to the second embodiment, the facing surface of the ceiling plate 220 is inclined such that the gap between the facing surfaces of the mounting table 210 and the ceiling plate 220 becomes wider at the downstream side than at the upstream side in the flow direction of the source gas. Accordingly, similarly to the first embodiment, the uniformity of the gas density between the upstream side and the downstream side can be improved by decreasing the pressure difference between the upstream side and the downstream side in the flow direction of the source gas. As a result, the in-plane uniformity of the film can be improved.

Third Embodiment

Figure 11:
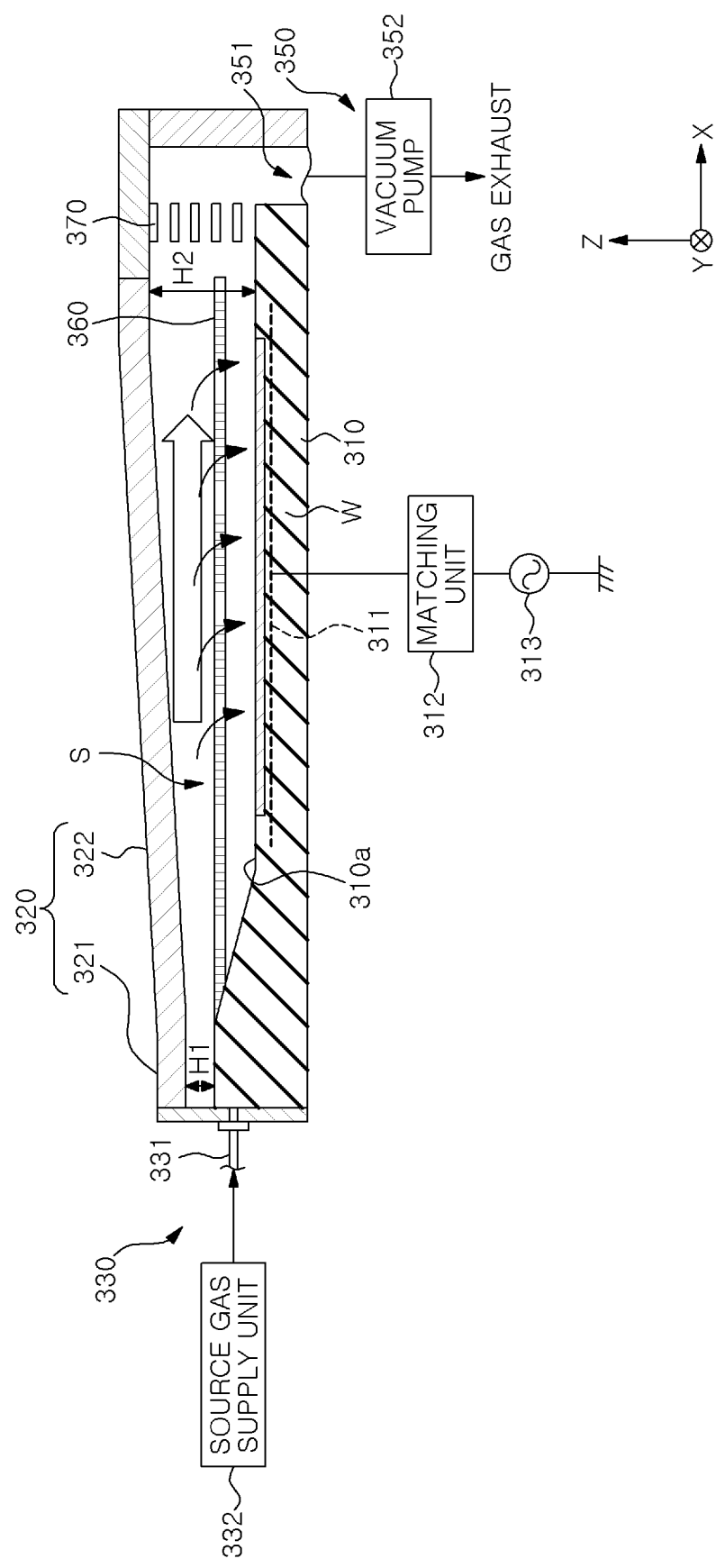
FIG. 11 schematically shows an example a film forming apparatus according to a third embodiment.

A film forming apparatus according to a third embodiment will be described. FIG. 11 schematically shows an example of the film forming apparatus according to the third embodiment.

As shown in FIG. 11, in the film forming apparatus according to the third embodiment, a recess 310a depressed downward is formed in a mounting table 310, and the substrate W is mounted on the recess 310a. A baffle plate 360 is attached to the upper surface of the mounting table 310 while being in parallel with an upper surface of the recess 310a with a predetermined gap therebetween.

As shown in FIG. 11, the film forming apparatus includes a mounting table 310, a ceiling plate 320, a gas supply mechanism 330, a gas exhaust unit 350, a baffle plate 360, and a rectifying blade 370. The mounting table 310 and the ceiling plate 320 constitute a processing chamber defining a processing space S for performing a film forming process on the substrate W.

The mounting table 310 is configured to mount the substrate W on an upper surface thereof. The mounting table 310 is made of a ceramic material such as AlN or the like. The mounting table 310 has a recess 310a depressed downward, and the substrate W is mounted on the upper surface of the recess 310a. A lower electrode 311 such as a mesh electrode or the like is provided in the mounting table 310. The lower electrode 311 is electrically connected to a high frequency power supply 313 via a matching unit 312. Accordingly, a high frequency power generated by the high frequency power supply 313 is supplied to the lower electrode 311 through the matching unit 312.

The ceiling plate 320 may have the same configuration as that of the ceiling plate 220 of the film forming apparatus according to the second embodiment. In other words, the ceiling plate 320 has a horizontal portion 321 and an inclined portion 322.

The gas supply mechanism 330 may have the same configuration as that of the gas supply mechanism 230 of the film forming apparatus according to the second embodiment. In other words, the gas supply mechanism 330 has a line 331 connected to a side surface of the processing chamber and a source gas supply unit 332 connected to one end of the line 331 which opposite to the other end connected to the processing chamber.

The gas exhaust unit 350 may have the same configuration as that of the gas exhaust unit 250 of the film forming apparatus according to the second embodiment. In other words, the gas exhaust unit 350 includes a gas exhaust port 351 and a vacuum pump 352.

The baffle plate 360 is attached to the upper surface of the mounting table 310. The baffle plate 360 is in parallel with the upper surface of the recess 310a of the mounting table 310 with a predetermined gap therebetween. The baffle plate 360 is made of a metal material. Therefore, the baffle plate 360 adjusts the flow of the source gas and serves as an upper electrode. The baffle plate 360 is grounded. The baffle plate 360 may be a perforated plate or a mesh plate. By providing the baffle plate 360, the in-plane uniformity of the temperature of the substrate W can be improved. Since the plasma can be confined between the mounting table 310 and the baffle plate 360, the uniformity of the plasma can be improved.

Although it is not necessary to provide the baffle plate 360, it is preferable to provide the baffle plate 360 in order to improve the in-plane uniformity of the temperature of the substrate W.

The baffle plate 160 may be movable so that it can be retreated when loading and unloading the substrate W.

The rectifying blade 370 rectifies the source gas flowing from the processing space S toward the gas exhaust port 351.

As described above, in the film forming apparatus according to the third embodiment, the facing surfaces of the mounting table 310 and the ceiling plate 320 are inclined such that the gap between the facing surfaces of the mounting table 310 and the ceiling plate 320 becomes wider at the downstream side than at the upstream side in the flow direction of the source gas. Accordingly, similarly to the first embodiment, the uniformity of the gas density between the upstream side and the downstream side can be improved by decreasing the pressure difference between the upstream side and the downstream side in the flow direction of the source gas. As a result, the in-plane uniformity of the film can be improved.

Fourth Embodiment

Figure 12A:
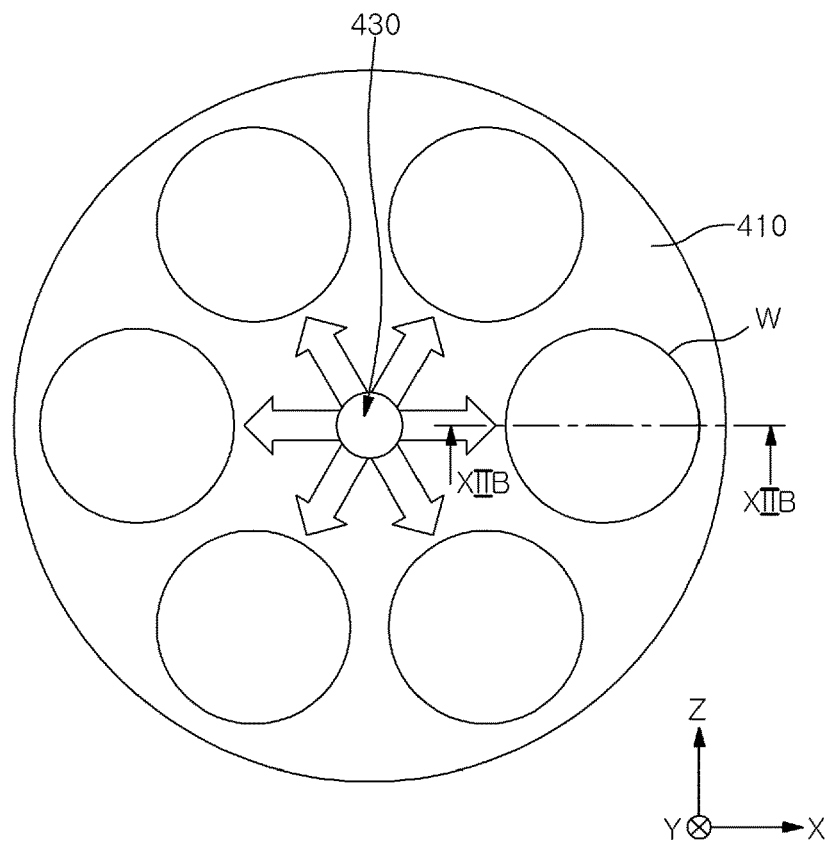
FIGS. 12A and 12B schematically show an example of a film forming apparatus according to a fourth embodiment.
Figure 12B:
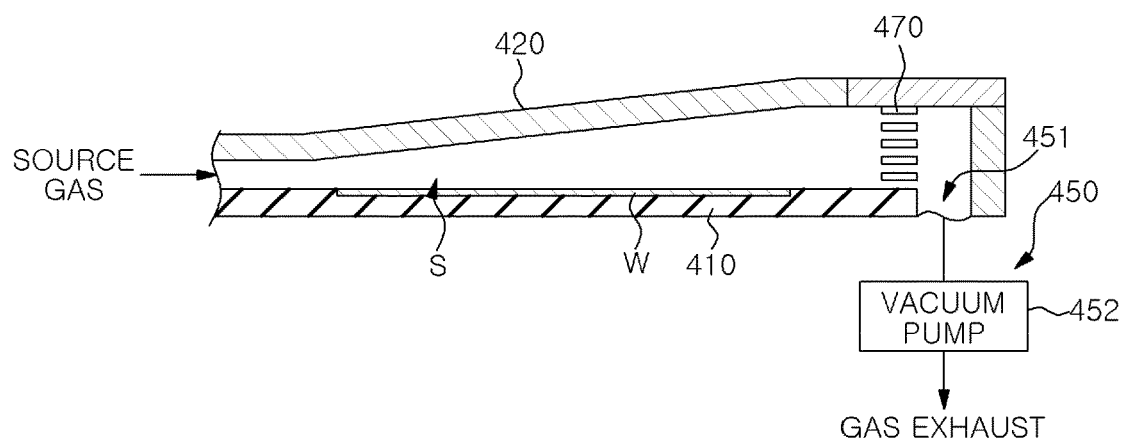

A film forming apparatus according to a fourth embodiment will be described. FIGS. 12A and 12B schematically show an example of the film forming apparatus according to the fourth embodiment. FIG. 12A is a top view, and FIG. 12B is a cross sectional view taken along a dashed dotted line XIIB-XIIB in FIG. 12A. In FIG. 12A, the illustration of the ceiling plate 420 is omitted for convenience of explanation.

As shown in FIG. 12A, the film forming apparatus according to the fourth embodiment is a semi-batch type film forming apparatus having a mounting table 410 capable of mounting thereon a plurality of (e.g., six) substrates W along a circumferential direction. In the film forming apparatus according to the fourth embodiment, the gas such as the source gas, the carrier gas, the reactant gas or the like can be supplied in a radial direction from a gas supply mechanism 430 provided at a central portion of the mounting table 410 toward a gas exhaust unit 450 (a gas exhaust port 451 and a vacuum pump 452) provided at a peripheral portion of the mounting table 410. At this time, the gas such as the source gas or the like is rectified by a rectifying blade 470 while moving from the processing space S toward the gas exhaust port 451. Each region on which the substrate W is mounted may have the same configuration as that in the first to the third embodiment.

In other words, as shown in FIG. 12B, for example, in a region on which a single substrate W is mounted, a gap between the facing surfaces of the mounting table 410 and the ceiling plate 420 becomes wider at the downstream side than at the upstream side in the flow direction of the source gas.

As described above, in the film forming apparatus according to the fourth embodiment, the facing surface of the ceiling plate 420 side is inclined such that the gap between the facing surfaces of the mounting table 410 and the ceiling plate 420 becomes wider at the downstream side than at the upstream side in the flow direction of the source gas. Accordingly, similarly to the first embodiment, the uniformity of the gas density between the upstream side and the downstream side can be improved by decreasing the pressure difference between the upstream side and the downstream side in the flow direction of the source gas. As a result, the in-plane uniformity of the film can be improved.

TEST EXAMPLES

Next, a CFD (Computational Fluid Dynamics) simulation performed to check the effect of the film forming apparatus according to the embodiment will be described.

Test Example 1

In a test example 1, the relation between the position x (m) and the pressure (Pa) in the gas flow direction on the substrate in the case of supplying gases ($Ar/O_2$=2000/500 sccm) from the first gas supply mechanism 130 to the processing space S by using the film forming apparatus according to the first embodiment was obtained. The followings are the simulation conditions in the test example 1.

<Simulation Conditions>

Length of the mounting table 110 along the gas flow direction: 500 mm

Length of the mounting table 110 along a direction perpendicular to the gas flow direction: 500 mm Gap H1 between the upper surface of the mounting table 110 and the lower surface of the horizontal portion 121: 5 mm Gap H2 between the upper surface of the mounting table 110 and the lower surface of the right end of the inclined portion 122: 43.4 mm Baffle plate 160: perforated plate (opening ratio of 0.5, transmittance of $10^{-7}$ $m^2$) or metal mesh (opening ratio of 0.9, transmittance of $10^{-5}$ $m^2$)

Length of the baffle plate 160 along the gas flow direction: 425 mm

Substrate size: φ300 mm

Gas temperature: 100° C.

Figure 13:
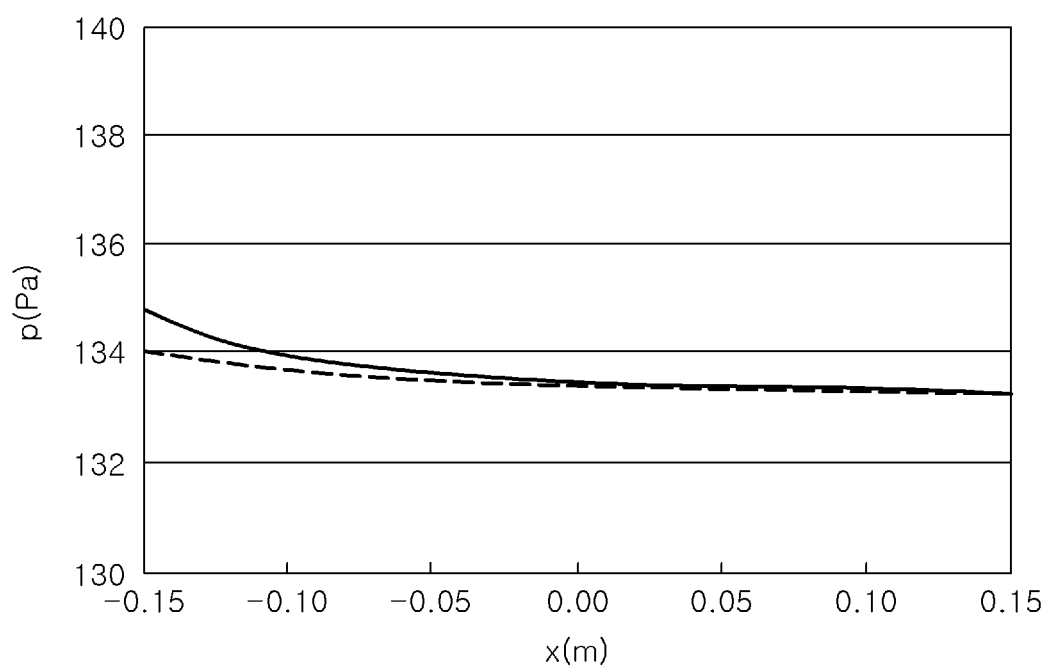
FIG. 13 shows a relation between a position and a pressure in a gas flow direction on a substrate.

Pressure of the connecting portion between the processing space S and the gas exhaust unit 150: 133 Pa FIG. 13 shows the relation between the position and the pressure in the gas flow direction on the substrate. In FIG. 13, the horizontal axis represents the position x (m) from the center of the substrate W. Here, a negative value indicates the upstream side in the gas flow direction, and a positive value indicates the downstream side in the gas flow direction. In FIG. 13, the vertical axis represents the pressure p (Pa). Further, in FIG. 13, a solid line shows a result obtained when the baffle plate 160 is a perforated plate and a dashed line shows a result obtained when the baffle pate 160 is a metal mesh.

As shown in FIG. 13, the pressure difference between the upstream side and the downstream side in the gas flow direction on the substrate is less than 2 Pa in both cases where the baffle plate 160 is a perforated plate and a metal mesh. From this, it is clear that the side flow type film forming apparatus can realize extremely uniform pressure distribution that is substantially the same as that in a shower head type film forming apparatus.

Test Example 2

In a test example 2, the characteristics at the time of adding a source gas ($TiCl_4$=100 sccm) in a state where the carrier gas (Ar=1000 sccm) was supplied from the first gas supply mechanism 130 to the processing space S by using the film forming apparatus according to the first embodiment were obtained. The conditions such as sizes and positions of the respective components of the film forming apparatus are the same as those in the test example 1.

<Characteristics>

Pressure (Pa) of the processing space S

Density of Ar on the substrate ($1/cm^3$)

Density of $TiCl_4$ on the substrate ($1/cm^3$)

Figure 14A:
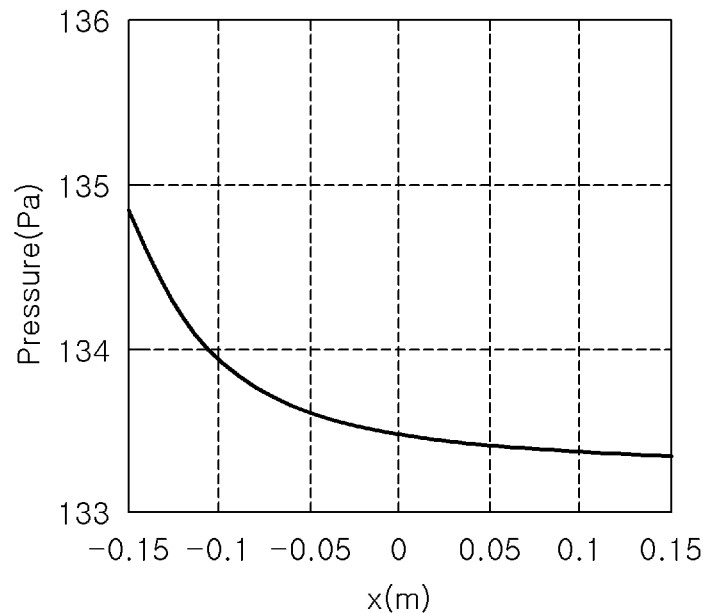
FIGS. 14A to 14C show a relation between positions and characteristics in a gas flow direction on a substrate.
Figure 14B:
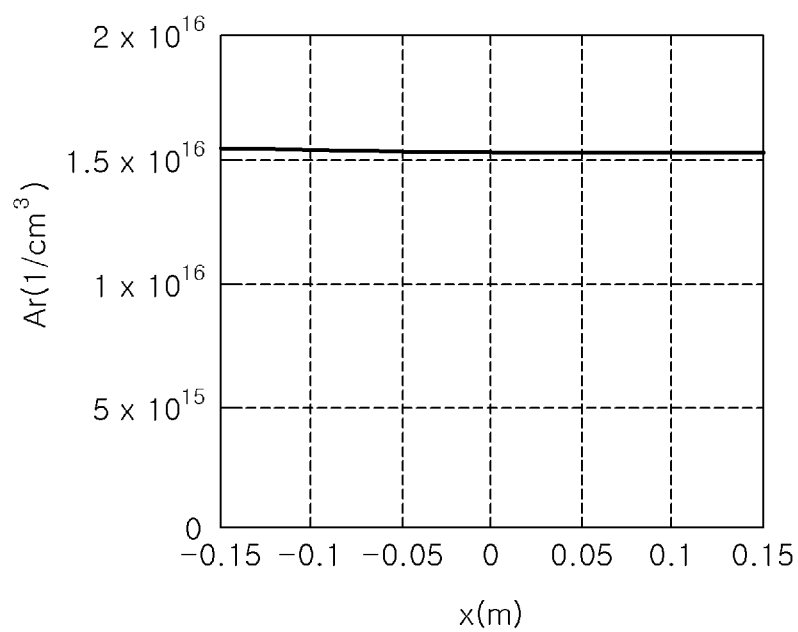
Figure 14C:
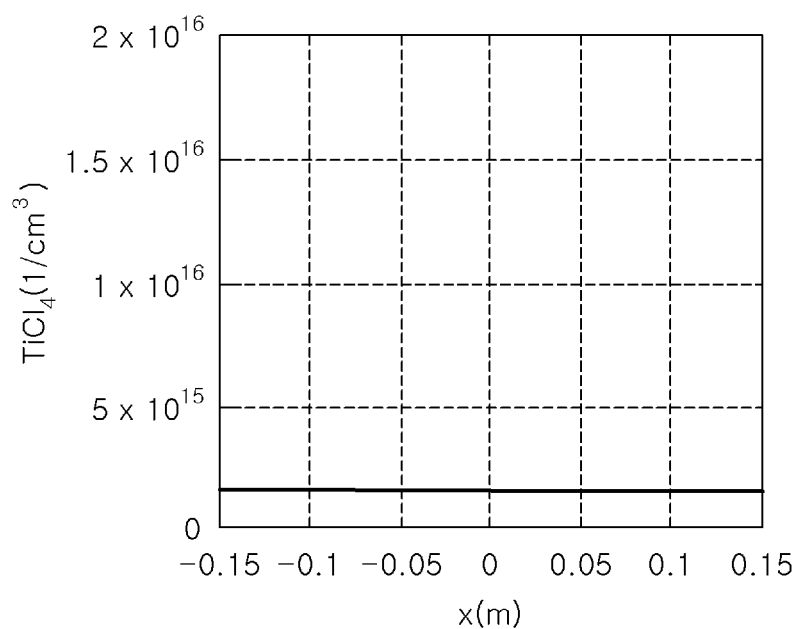

FIGS. 14A to 14C show relation between the position and each characteristic in the gas flow direction on the substrate. In FIGS. 14A to 14C, the characteristics obtained after 0.34 seconds elapsed from the start of supply of $TiCl_4$ are illustrated. FIG. 14A shows the relation between the position and the pressure in the gas flow direction on the substrate. FIG. 14B shows the relation between the position and the Ar density in the gas flow direction on the substrate. FIG. 14C shows the relation between the position and the $TiCl_4$ density in the gas flow direction on the substrate.

As shown in FIG. 14A, the pressure difference between the upstream side and the downstream side in the gas flow direction on the substrate was less than 2 Pa when 0.34 seconds elapsed from the start of supply of $TiCl_4$. As shown in FIGS. 14B and 14C, the gas was replaced by a gaseous mixture of Ar and $TiCl_4$ (Ar:$TiCl_4$=10:1) at any position in the gas flow direction on the substrate when 0.34 seconds elapsed from the start of supply of $TiCl_4$. In other words, the gas replacement can be performed within a short period of time. Therefore, this is suitable for an ALD method in which the supply of the source gas and the supply of the reactant gas need to be repeated within a short period of time.

As shown in FIG. 14C, when 0.34 seconds elapsed from the start of supply of $TiCl_4$, the $TiCl_4$ density distribution was uniform on the surface of the substrate due to uniform spread of $TiCl_4$ from the upstream side to the downstream side in the gas flow direction on the substrate. Since the $TiCl_4$ density distribution is uniform on the surface of the substrate, $TiCl_4$ is uniformly adsorbed on the surface of the substrate by the relation shown in Eq. (3). As a result, the in-plane uniformity of the characteristics (e.g., a film thickness, a film quality or the like) of the film formed on the surface of the substrate W can be improved.

While the embodiments of the present disclosure have been described, the above contents do not limit the contents of the present disclosure, and various modifications and improvements can be made within the scope of the present disclosure.

While the capacitive coupled plasma has been described as an example of the plasma generation source in the above embodiments, the present disclosure is not limited thereto. The plasma generation source may also be, e.g., an inductively coupled plasma, a microwave plasma, or dielectric barrier discharge.

While the present disclosure has been shown and described with respect to the embodiments, it will be understood by those skilled in the art that various changes and modifications may be made without departing from the scope of the present disclosure as defined in the following claims.

What is claimed is:

1. A film forming apparatus comprising:
a mounting table on which a substrate is mounted;
a ceiling plate facing the mounting table, the ceiling plate defining a processing space between the ceiling plate and the mounting table;
a gas supply mechanism configured to supply a source gas to the processing space horizontally with respect to the substrate, wherein a facing surface of the ceiling plate includes a horizontal portion provided in parallel with a facing surface of the mounting table and an inclined portion inclined such that a gap between the facing surfaces of the mounting table and the ceiling plate becomes wider at a downstream side than at an upstream side in a flow direction of the source gas;
a gas exhaust port configured to exhaust the source gas from the processing space;
a baffle plate provided between the mounting table and the ceiling plate, wherein the baffle plate extends from a boundary portion between the horizontal portion and the inclined portion on the facing surface of the ceiling plate toward the gas exhaust port and provided in parallel with the facing surface of the mounting table;
a plurality of flat rectifying blades arranged in parallel with each other along a direction perpendicular to the facing surface of the mounting table and provided at the downstream side in the flow direction of the source gas;
a plasma generation source disposed closer to the upstream side in the flow direction of the source gas compared to the processing space; and
an additional gas supply mechanism configured to supply a reactant gas to the processing space,
wherein the additional gas supply mechanism includes a first electrode and a second electrode provided in parallel with each other and the reactant gas is converted into plasma in a space between the first electrode and the second electrode and supplied to the processing space.

2. The film forming apparatus of claim 1, wherein the inclined portion of the ceiling plate is inclined to become higher from the upstream side to the downstream side in the flow direction of the source gas.

3. The film forming apparatus of claim 2, wherein the inclined portion of the ceiling plate is inclined such that a pressure at the upstream side and at the downstream side in the flow direction of the source gas becomes the same based on a viscosity coefficient, a temperature, a flow rate, and a pressure of the source gas.

4. The film forming apparatus of claim 1, wherein a gap between the facing surfaces of the mounting table and the ceiling plate is variable.

5. The film forming apparatus of claim 1, wherein the inclined portion of the ceiling plate is formed in a curved shape.

6. The film forming apparatus of claim 1, wherein the baffle plate is attached to the facing surface of the ceiling plate.

7. The film forming apparatus of claim 1, wherein the baffle plate is a perforated plate or a mesh plate.

8. The film forming apparatus of claim 1, wherein the ceiling plate and the baffle plate are made of a metal material and the mounting table is made of a dielectric material.

9. The film forming apparatus of claim 1, wherein the film forming apparatus further comprises an additional baffle plate provided in parallel with the baffle plate with a predetermined gap therebetween.

10. The film forming apparatus of claim 1, wherein the film forming apparatus further comprises an additional baffle plate provided in a direction perpendicular to the baffle plate.

11. The film forming apparatus of claim 1, wherein the mounting table is configured to mount thereon a plurality of substrates along a circumferential direction.

12. The film forming apparatus of claim 1, wherein a recess depressed downward is formed in the mounting table.

13. The film forming apparatus of claim 1, wherein the film forming apparatus further comprises an additional baffle plate provided in a direction perpendicular to the baffle plate, wherein the additional baffle plate is provided between the baffle plate and the inclined portion of the ceiling plate.

* * * * *